(12) United States Patent
Inoko

(10) Patent No.: US 9,164,263 B2
(45) Date of Patent: Oct. 20, 2015

(54) ILLUMINATION OPTICAL SYSTEM AND PROJECTION-TYPE DISPLAY APPARATUS

(71) Applicant: CANON KABUSHIKI KAISHA, Tokyo (JP)

(72) Inventor: Kazuhiro Inoko, Utsunomiya (JP)

(73) Assignee: CANON KABUSHIKI KAISHA (JP)

( * ) Notice: Subject to any disclaimer, the term of this patent is extended or adjusted under 35 U.S.C. 154(b) by 157 days.

(21) Appl. No.: 14/063,510

(22) Filed: Oct. 25, 2013

(65) Prior Publication Data
US 2014/0118707 A1 May 1, 2014

(30) Foreign Application Priority Data

Oct. 25, 2012 (JP) .................................. 2012-235400

(51) Int. Cl.
| | |
|---|---|
| G03B 21/14 | (2006.01) |
| G02B 13/22 | (2006.01) |
| G02B 27/00 | (2006.01) |
| G02B 19/00 | (2006.01) |
| G03B 21/20 | (2006.01) |
| G03F 7/20 | (2006.01) |

(52) U.S. Cl.
CPC ............ *G02B 13/22* (2013.01); *G02B 19/0014* (2013.01); *G02B 19/0047* (2013.01); *G02B 27/0025* (2013.01); *G03B 21/208* (2013.01); *G03F 7/70241* (2013.01)

(58) Field of Classification Search
CPC ... G02B 13/22; G03F 7/70225; G03F 7/7024; G03F 7/70066
USPC ............ 353/30, 34, 37, 38, 94, 97, 102; 359/649, 650, 683, 717, 727, 754, 759, 359/765, 772; 355/30, 53, 55, 67, 68
See application file for complete search history.

(56) References Cited

U.S. PATENT DOCUMENTS

| | | | |
|---|---|---|---|
| 6,299,313 B1 * | 10/2001 | Hirata et al. ................... 353/54 |
| 6,561,656 B1 | 5/2003 | Kojima et al. | |
| 8,403,496 B2 | 3/2013 | Qu et al. | |
| 2004/0009415 A1 * | 1/2004 | Shigematsu et al. ............. 430/7 |
| 2006/0028954 A1 | 2/2006 | Aruga | |
| 2007/0200473 A1 | 8/2007 | Kyomoto et al. | |
| 2012/0162610 A1 | 6/2012 | Maeda et al. | |

FOREIGN PATENT DOCUMENTS

| | | |
|---|---|---|
| CN | 1721980 A | 1/2006 |
| CN | 1922543 A | 2/2007 |

(Continued)

OTHER PUBLICATIONS

Office Action issued in CN201310496502.3, mailed Apr. 3, 2015.

*Primary Examiner* — Sultan Chowdhury
(74) *Attorney, Agent, or Firm* — Rossi, Kimms & McDowell LLP

(57) ABSTRACT

An illumination optical system is configured to illuminate an optical modulator configured to modulate incident light and includes a condenser lens system that includes a meniscus lens with a concave on a light source side, and condenses light from a light source; and a spherical aberration corrector disposed on an optical modulator side of the condenser lens system. The illumination optical system satisfies:

$$0.6 < |f/L| < 1.4$$

$$0.9 < \sin\theta \leq 1.0$$

where f is a focal length of the condenser lens system, L is a length from an object-side principal point of the condenser lens system to the light source, and θ is half an angle at which the condenser lens system takes in the light from the light source.

15 Claims, 3 Drawing Sheets

(56) References Cited

FOREIGN PATENT DOCUMENTS

| CN | 101943845 A | 1/2011 |
| CN | 102591017 A | 7/2012 |
| CN | 102650738 A | 8/2012 |
| JP | 05-273644 A | 10/1993 |
| JP | 2003091045 A | 3/2003 |
| JP | 2005-208571 A | 8/2005 |

* cited by examiner

YZ SECTION

XZ SECTION

ILLUMINATION OPTICAL SYSTEM AND PROJECTION-TYPE DISPLAY APPARATUS

BACKGROUND OF THE INVENTION

1. Field of the Invention

The present invention relates to an illumination optical system and a projection-type display apparatus.

2. Description of the Related Art

A light source in a conventional liquid crystal projector makes parallel, by a parabolic reflector, light from a high-pressure mercury lamp in which a lamp tube extends in parallel to an optical axis, and emits the parallel light. However, a part of the light reflected by the reflector is blocked by the lamp, and the light utilization efficiency reduces. Accordingly, it has recently been proposed to use a light source with having a high diffusion power, such as a light emitting diode or a laser, or to dispose a lamp tube of a high-pressure mercury lamp perpendicular to the optical axis. It is thus important for an illumination optical system to effectively take in light from the light source with a high numerical aperture ("NA").

Japanese Patent Laid-Open No. ("JP") 2005-208571 proposes to collimate a diffused light flux taken from a light source by an aspherical lens. Further, JP 05-273644 proposes to condense a light flux taken from the light source by two Fresnel lenses.

It is important for a projection-type display apparatus, such as a liquid crystal projector, to have a small size with an improved light utilization efficiency. When the light flux from the light source is collimated by an aspherical lens as disclosed in JP 2005-208571, it is difficult to miniaturize the optical system in the subsequent stages. The technique disclosed in JP 05-273644 is advantageous in miniaturization in that the light flux is focused but taking in light from a light source having a high diffusing power requires a considerably large Fresnel, preventing the miniaturization. A tandem system configured to make parallel a flux (in a paraxial region) as disclosed in JP 2005-208571 is more advantageous in enhancing the light utilization efficiency than the focusing system disclosed in JP 05-273644.

For example, assume a liquid crystal projector that includes a pair of fly-eye lenses and a polarization converter array disposed just behind it. The polarization converter array includes micro polarization beam splitters arrayed at regular intervals, and a half waveplate stuck at every other pitch. The polarization converter array converts the non-polarized light flux from the light source into linearly polarized light in one direction. The polarization converter cannot provide a proper polarization conversion and its light utilization efficiency reduces, unless a light source image formed near a second fly-eye lens when it is viewed from the light source side is taken in an effective light area of every other pitch. In the second fly-eye lens, each lens cell thereof corresponds to each lens cell of the first fly-eye lens on a one-to-one basis, and thus the light source image shifted from the corresponding lens cells causes a loss of light. Accordingly, making the light source image formed near the second fly-eye lens a smaller spot improves the light utilization efficiency.

Assume that each of the optical systems disclosed in JPs 2005-208571 and 05-273644 is provided in front of the first fly-eye lens is assumed. Then, the method of JP 2005-208571 causes the later stage of the first fly-eye lens to be bigger in accordance with the angles of the light flux taken in from the light source. For example, the optical system that has an angle of 65° of the light flux taken from the light source becomes bigger by approximately 30% than that has the angle of 45°. Further, in the method of JP 05-273644, the image-side principal point of composite lenses of the Fresnel lens and the first fly-eye lens shifts closer to the light source side than that of the first fly-eye lens alone, causing a large paraxial magnification, a large light source image, and a reduced light utilization efficiency.

SUMMARY OF THE INVENTION

The present invention provides an illumination optical system and a projection-type display apparatus configured to improve a miniaturization and light utility efficiency.

An illumination optical system according to the present invention is configured to illuminate an optical modulator configured to modulate incident light. The illumination optical system includes a condenser lens system that includes a meniscus lens with a concave on a light source side, and condenses light from a light source, and a spherical aberration corrector disposed on an optical modulator side of the condenser lens system. The illumination optical system satisfies:

$$0.6 < |f/L| < 1.4$$

$$0.9 < \sin\theta \leq 1.0$$

where f is a focal length of the condenser lens system, L is a length from an object-side principal point of the condenser lens system to the light source, and θ is an angle at which the condenser lens system takes in the light from the light source. θ is be half an angle between an outermost ray that can pass the optical system and the optical axis of the optical system on a section that contains the optical axis.

Further features of the present invention will become apparent from the following description of exemplary embodiments with reference to the attached drawings.

DESCRIPTION OF THE EMBODIMENTS

A description will now be given of an illumination optical system applicable to a projection-type display apparatus according to this embodiment. A description will now be given of a liquid crystal projector as an example of the projection-type display apparatus. A liquid crystal projector is a liquid crystal display apparatus that drives liquid crystal panels (optical modulators) each configured to modulate incident light according to an image signal, and to project (in a magnified manner) an image on a not-shown target surface (such as a screen) by using light from the light source.

First Embodiment

Figure 1:
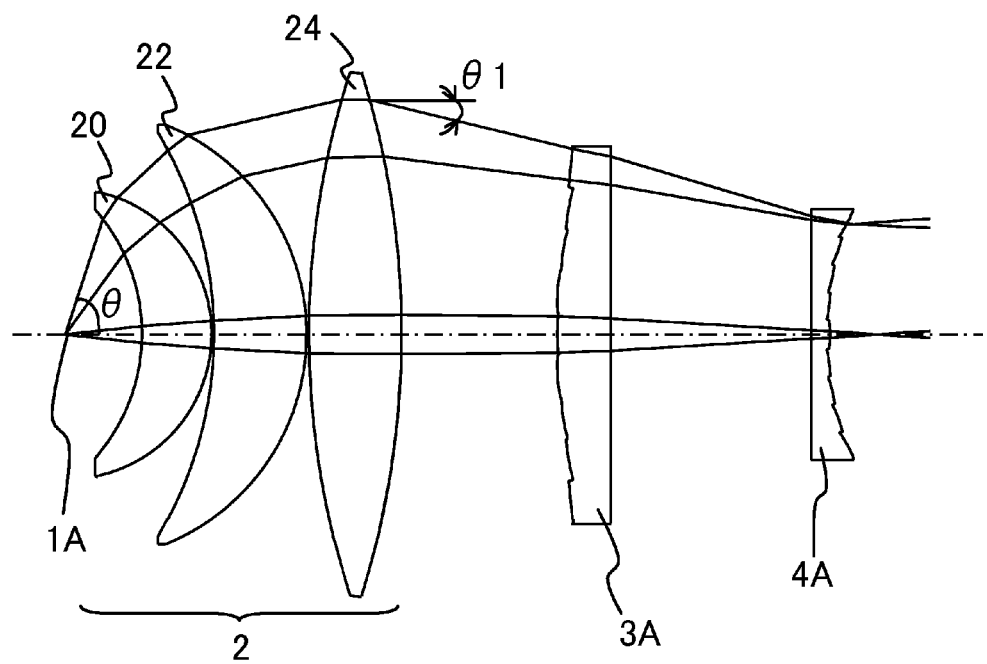
FIG. 1 is an optical path diagram of a light source and an illumination optical system according to a first embodiment of the present invention.

Referring now to FIG. 1, a description will be given of a light source and an illumination optical system according to a first embodiment. FIG. 1 is an optical path diagram of an illumination optical system from a light source 1A to a second fly-eye lens 4A. The light source 1A is, for example, a light emitting diode or a laser, and a light flux emitted from the light source 1A is diffused light. An illumination optical system is disposed just behind the light source 1A. The illumination optical system includes a condenser lens system 2 configured to condense light from the light source 1A, and two fly-eye lenses (a first fly-eye lens 3A and a second fly-eye lens 4A) configured to make uniform the light that has passed the condenser lens system 2, although the optical system may further include other optical elements. The first fly-eye lens 3A serves to divide the light emitted from the condenser lens system 2 into a plurality of light fluxes.

The condenser lens system 2 is designed to capture light from the light source with NA=0.95. The capturing angle on the object side is represented by NA=sin θ. The larger the angle represented by θ in FIG. 1, the larger amount of light it captures. A conditional expression $0.9 < \sin \theta \leq 1.0$ may be satisfied, and a conditional expression $0.93 < \sin \theta$ may be further satisfied, so as to utilize light more effectively.

The condenser lens system 2 of this embodiment includes three spherical lenses, or includes, in order from the light source side along the optical path, a first spherical lens 20 having a meniscus shape with a concave on the light source side, a second spherical lens 22 having a meniscus shape with a concave on the light source side, and a third spherical lens 24 having a biconvex shape. The shapes of these lenses are shown in numerical example 1. The angle θ1 as half an angle formed by the outermost light lay refracted by the third spherical lens 23 and the optical axis ranges in $10° < \theta 1 < 30°$. In this description, the outermost light lay is referred to as the light lay passing through the outermost portion among the light fluxes scattered by the edge portion of the lens disposed on the light source side with respect to the first fly-eye lens 3A.

The configuration of the condenser lens system 2 is not limited to that of this embodiment, and may include at least one meniscus lens with a concave on the light source side. The meniscus lens need not be a spherical lens, and may alternatively be an aspherical lens. The number of the lenses is not limited to three. The illumination optical system may be made smaller when it uses the meniscus lens than when it uses a Fresnel lens.

A focal length f of the condenser lens system 2 is 22.3 mm. In this embodiment, 5 mm<f<50 mm may be satisfied. When f is larger than the upper limit, the system is enlarged, whereas when f is smaller than the lower limit, the system will be hard to realize.

An object-side principal point is located at a position 13.6 mm apart from the first surface of the lens to the image side. The length L from the light source 1A to the object-side principal point is 23.6 mm. In other words, the light source 1A is disposed near the object-side focal point of the condenser lens system 2. A conditional expression $0.6 < |f/L| < 1.4$, or $0.8 < |f/L| < 1.2$ or $0.9 < |f/L| < 1.1$ will limit the light source to a position near the object-side focal point.

Since the light source 1A is disposed near the object-side focal point paraxial to the condenser lens system 2, the light flux near the optical axis, among those emitted from the condenser lens system 2, is mostly parallel and enters the first fly-eye lens 3A. The focal length of the lens cell of the first fly-eye lens 3A near the optical axis almost matches the length between the first fly-eye lens 3A and the second fly-eye lens 4A, so that the light source image is formed near the second fly-eye lens 4A. In a paraxial view, since the light flux entering the first fly-eye lens 3A is mostly parallel, an angle of the light ray condensed at the light source image may be enlarged, and the magnification of the light source image may be decreased. Generally, a light source has a high intensity near the optical axis, and making smaller the light source image near the optical axis (or reducing the paraxial magnification) greatly improves the light utilization efficiency.

On the other hand, peripheral light fluxes are also emitted toward the first fly-eye lens 3A by the condenser lens system 2, although the condenser lens system 2 causes a moderate spherical aberration. In other words, such light fluxes are not parallel unlike the light flux near the optical axis, and condense toward the optical axis indicated by an alternate long and short dash line. As a result, the first fly-eye lens 3A, the second fly-eye lens 4A, and the subsequent optical system (which is not shown) can be made smaller. The peripheral light fluxes are condensed to enter the first fly-eye lens 3A, and then the condensed light fluxes form an image at the second fly-eye lens 4A.

In order to prevent the peripheral light fluxes from shifting from the lens cell of the second fly-eye lens 4A in the above configuration, a spherical aberration corrector configured corrects the spherical aberration in the area distant from the optical axis in the subsequent stage (on the optical modulator side) of the condenser lens system 2.

This embodiment provides the spherical aberration corrector at the first fly-eye lens 3A. In other words, the focal length of the first lens cell which is located at the peripheral portion of the first fly-eye lens 3A is set to be longer than that of the second lens cell which is located closer to the optical axis than the first lens cell. Alternatively, the power (or the radius of curvature) of the first lens cell is set to be small. When the lens cell focal length of the peripheral portion is represented by fe, and that of the center portion is represented by fc, $2 < fe/fc$, preferably $3 < fe/fc$, and even more preferably $10 < fe/fc$ are satisfied. The upper limit is, for example, 100.

As described above, this embodiment makes small the light source image near the optical axis, and improves the light utilization efficiency. Further, the peripheral light fluxes are condensed by spherical aberration, and the subsequent stage components may be downsized.

NUMERICAL EXAMPLE 1

| unit f = 22.3 mm NA = sinθ = 0.95 L = 23.6 mm f/L = 0.945 | | | |
|---|---|---|---|
|  | radius of curvature | surface separation | refractive index |
| Obj | ∞ | 10.0 |  |
| 1 | −23.91 | 9.0 | 1.834 |
| 2 | −18.68 | 0.3 |  |
| 3 | −49.59 | 12.0 | 1.773 |
| 4 | −29.18 | 0.3 |  |
| 5 | 110.00 | 12.0 | 1.773 |
| 6 | −110.00 |  |  |

Second Embodiment

Figure 2:
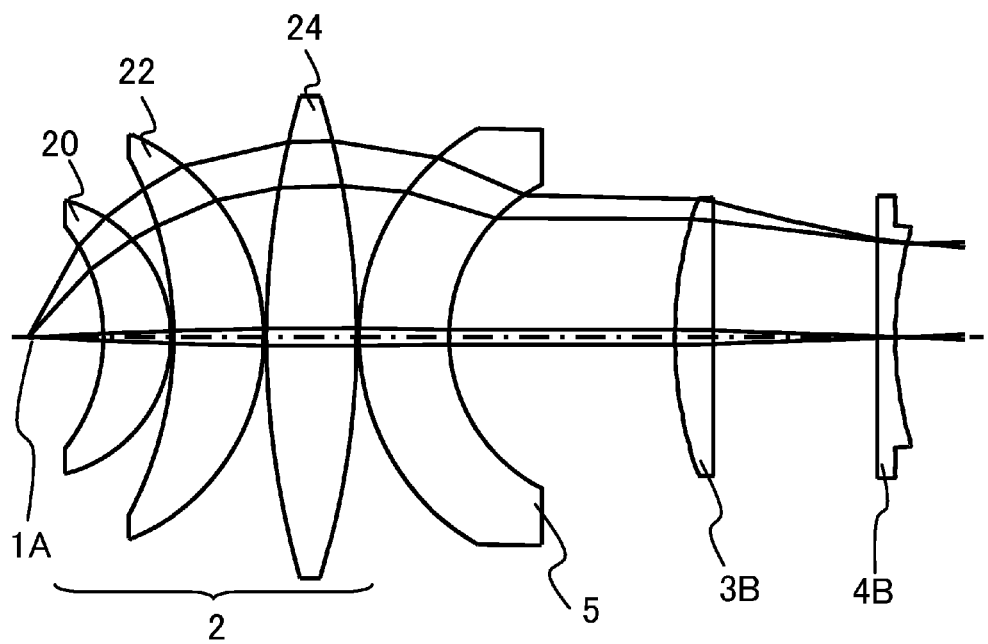
FIG. 2 is another optical path diagram of a light source and an illumination optical system according to a second embodiment of the present invention.

Referring now to FIG. 2, a description will be given of a light source and an illumination optical system according to the second embodiment. FIG. 2 is an optical path diagram from a light source 1A to a second fly-eye lens 4B. The second embodiment is different from the first embodiment in that a spherical aberration corrector 5 is disposed between the condenser lens system 2 and the first fly-eye lens 3B, and that the difference in the focal length of the first lens cell in the peripheral portions of the first fly-eye lens 3B and that of the second lens cell near the optical axis is small. The second fly-eye lens 4B is similar to the second fly-eye lens 4A.

The spherical aberration corrector 5 has a small refractive power (or has none), and is a meniscus lens having a convex shape on the light source side. The focal length of this meniscus lens is −275.5 mm, and has a small paraxial refractive power. Thereby, the light flux near the optical axis among the light fluxes emitted from the condenser lens system 2 is hardly affected.

Thus, similar to the first embodiment, the light flux near the optical axis is condensed near the second fly-eye lens 4B with a small paraxial magnification, and provides a high light utilization efficiency. On the other hand, the peripheral light fluxes are condensed in the optical axis direction by the spherical aberration of the condenser lens system 2. The meniscus lens has a strong curvature, which generates a strong negative spherical aberration for the peripheral light fluxes and corrects the spherical aberration. As a result, the peripheral light fluxes are condensed, then are substantially made parallel and enter the first fly-eye lens 3B. Each cell of the first fly-eye lens 3B forms the light source image near the second fly-eye lens 4B.

This embodiment corrects the aberration before the light enters the first fly-eye lens 3B, and reduces a difference between the focal lengths of the center cell and the peripheral cell. Numerical example 2 describes a lens configuration according to this embodiment including the spherical aberration corrector 5. When the paraxial refractive power is represented by fmenis, the spherical aberration corrector 5 satisfies 50 mm<|fmenis|, or 100 mm<|fmenis|, or 200 mm<|fmenis|. The upper limit is, for example, 2000 mm. Even this embodiment can prevent the light utilization efficiency from decreasing due to the enlarged the light source image, and reduce the size.

NUMERICAL EXAMPLE 2

| unit |
| --- |
| condenser lens system (first to sixth surfaces) |
| f = 22.3 mm NA = sinθ = 0.95 L = 23.6 mm f/L = 0.945 |
| spherical aberration corrective lens: fmenis = −876 mm |

|  | radius of curvature | surface separation | refractive index |
| --- | --- | --- | --- |
| Obj | ∞ | 10.0 |  |
| 1 | −23.91 | 9.0 | 1.834 |
| 2 | −18.68 | 0.3 |  |
| 3 | −49.59 | 12.0 | 1.773 |
| 4 | −29.18 | 0.3 |  |
| 5 | 110.00 | 12.0 | 1.773 |
| 6 | −110.00 | 0.3 |  |
| 7 | 31.74 | 12.0 | 1.487 |
| 8 | 22.50 |  |  |

Third Embodiment

Figure 3A:
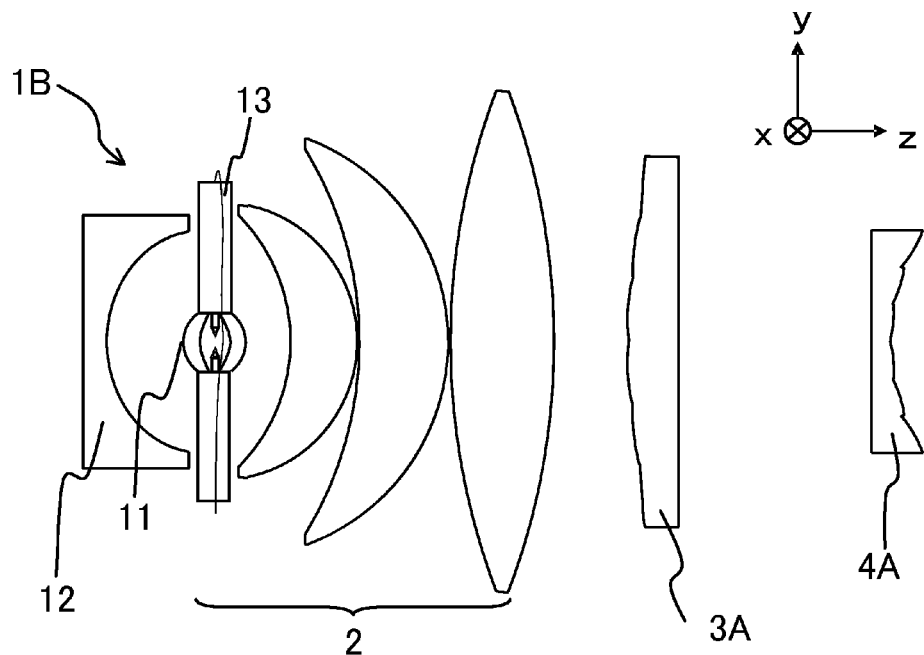
FIGS. 3A and 3B are still other optical path diagrams of a light source and an illumination optical system according to a third embodiment of the present invention.
Figure 3B:
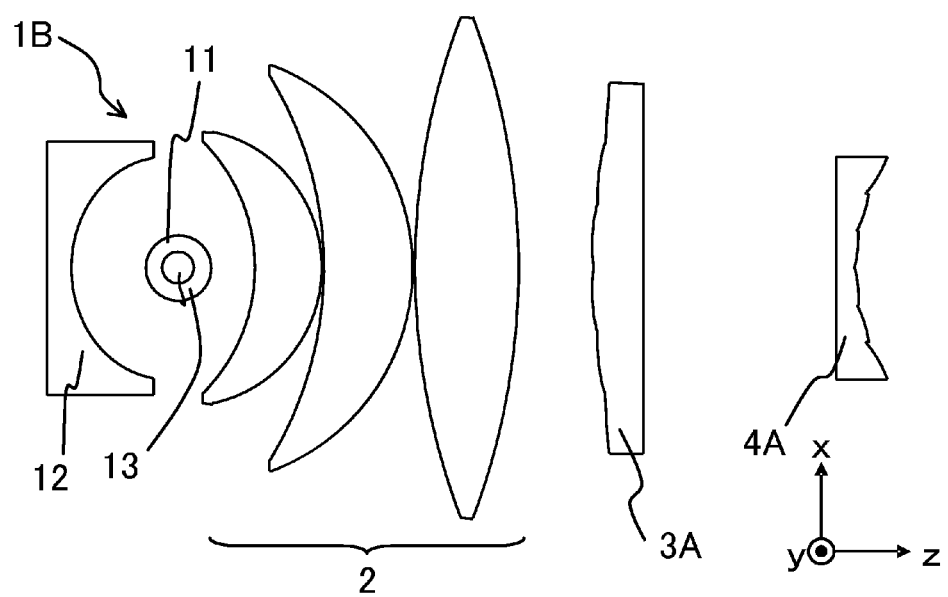

Referring now to FIGS. 3A and 3B, a description will be given of a light source and an illumination optical system according to a third embodiment. FIGS. 3A and 3B are optical path diagrams from a high-pressure mercury lamp which is a light source 1B to a second fly-eye lens 4A. The optical axis direction is defined as z direction, a longitudinal direction of the high-pressure mercury lamp is defined as y direction, and a direction perpendicular to the yz surface is defined as x direction. FIG. 3A illustrates YZ section, and FIG. 3B illustrates XZ section.

The high-pressure mercury lamp includes a pair of electrodes, encapsulated gas, and a glass tube. An emission arc is formed by applying high voltage to the pair of electrodes. This embodiment arranges the lamp tube 11 in the y direction perpendicular to the optical axis, unlike the conventional lamp tubes extending in the optical axis direction.

The light emitting in the optical axis (z+) direction among the light fluxes emitting from the lamp tube 11 is condensed by the condenser lens system 2, and is led to the first fly-eye lens 3A, in the same manner as in first embodiment. On the other hand, the light is also emitted to the opposite side of the condenser lens system 2 (z-direction), and reflected by a return mirror 12 disposed on the opposite side of the condenser lens system 2.

The return mirror 12 has a so-called toric shape which has different shapes in the XZ section and in the YZ section, and cancel the aberration due to the glass tube shape of the lamp tube 11. The light flux emitted from the lamp tube 11 and reflected by the return mirror 12 returns to the original arc position with substantially no aberration. Subsequently, the light flux is led to the condenser lens system 2, in the same manner as that in the z+ direction. Since the light flux via the return mirror 12 more frequently passes the glass of the lamp tube, an anti-reflection structure such as an antireflective film is provided on the surface of the lamp tube 11 at least in the return mirror side.

This embodiment uses a condenser lens system of high NA and a reflector, and can take in almost all the light fluxes in for the YZ section. However, as for the XZ section, no matter how high the NA is, the light emitted to the X direction cannot be effectively led to the optical axis direction. Accordingly, a gap is inevitably generated at the border in the XZ section between the return mirror 12 and the condenser lens system 2.

Thus, this embodiment sets the direction of the lamp tube 11 as shown in FIG. 3 so that a trigger line 13 of the lamp tube 11 faces the gap. The trigger line 13 is a conductor wire to which the voltage necessary to activate the high-pressure mercury lamp is applied, and does not transmit light and loses light. This embodiment provides this gap at the border between the return mirror 12 and the condenser lens system 2, and minimizes the light loss.

A polarization converter array (not illustrated), a condenser lens (not illustrated), and a liquid crystal panel (not illustrated) are arranged just behind the second fly-eye lens 4A. The polarization converter array includes micro polarization beam splitters arrayed at regular intervals, and a half waveplate stuck at every other pitch. The polarization converter array converts the non-polarization light emitted from the second fly-eye lens 4A into linearly polarized light of one direction. The light fluxes that has passed the second fly-eye lens and the polarization converter array form images in a superimposed manner on the liquid crystal panel by the condenser lens.

Fourth Embodiment

Figure 4:
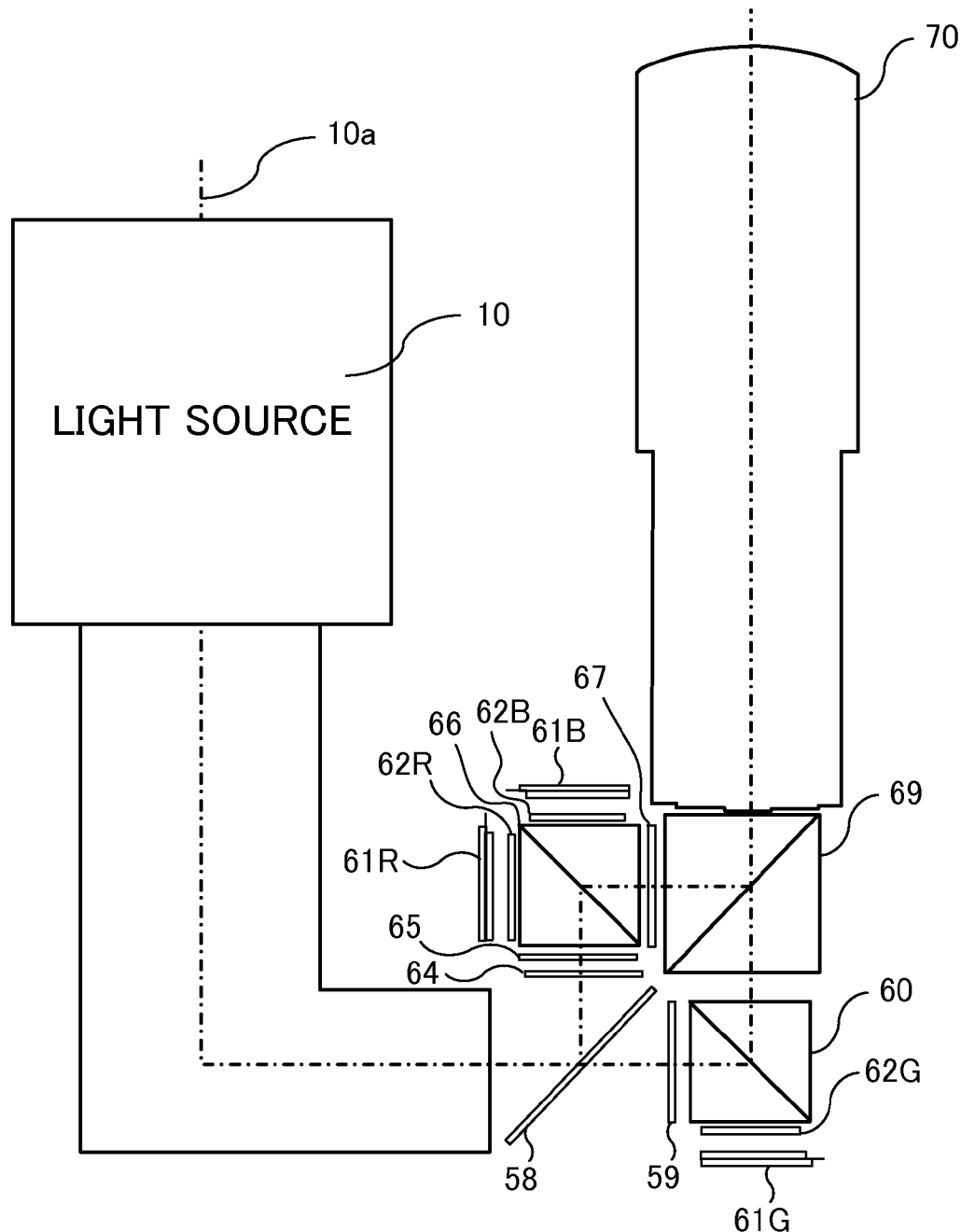
FIG. 4 is a schematic configuration diagram of a projection-type display apparatus according to the first, second, and third embodiments of the present invention.

FIG. 4 illustrates a schematic configuration diagram of a projector (a projection-type display apparatus) using the light source and the illumination optical system according to the first to third embodiments.

The light source 10 is the light source and the illumination optical system illustrated in the first to third embodiment. An alternate long and short dashed line in the diagram is the optical axis 10a of the light source 10.

The light emitted from the light source 10 enters a dichroic mirror 58. The dichroic mirror 58 separates the entered light into light of a first wavelength band including a red wavelength band and a blue wavelength band, and a second wavelength band including a green wavelength band.

The light of the green wavelength band separated by the dichroic mirror 58 passes through a polarization plate 59, is reflected by a first polarization beam splitter 60, passes through a quarter waveplate 62G, and then enters a liquid crystal panel 61G.

Among the light that has entered the liquid crystal panel 61G, image light of which polarization direction is changed by the liquid crystal panel 61G (which is the light to be projected to the target surface), enters the polarization beam splitter 60 again. Then, the image light is transmitted by the polarization beam splitter 60, a combination prism 69, and heads for a projection lens 70. The non-image light is reflected by the polarization beam splitter 60, and returns to the light source side.

The light of the first wavelength band separated by the dichroic mirror 58 passes through the polarization plate 64, and enters a wavelength selective phase-difference plate 65. The polarization direction of only the light of the blue wavelength band is rotated by 90° by the wavelength selective phase-difference plate 65.

The light of the blue wavelength band of which polarization direction is rotated is transmitted by a polarization beam splitter 66, passes through a ¼λ plate 62B, and enters the liquid crystal panel 61B.

Among the light having entered the liquid crystal panel 61B, the image light is reflected by the polarization beam splitter 60, passes through the wavelength selective phase-difference plate 67, is reflected by a combination prism 69, and heads for the projection lens 70. The non-image light is transmitted by the polarization beam splitter 66, and returns to the light source side.

On the other hand, the light of the red wavelength band which has been separated by the dichroic mirror 58, and then passed through the wavelength selective phase-difference plate 65 without being changed with the polarization direction thereof, is reflected by the polarization beam splitter 66, and enters the liquid crystal panel 61R. Among the light having entered the liquid crystal panel 61R, the image light is transmitted by the polarization beam splitter 66, converted with the polarization direction thereof by 90° by the wavelength selective phase-difference plate 68, and enters the combination prism 69. Then, the light is reflected by the combination prism 69, and heads for the projection lens 70. The non-image light is reflected by the polarization beam splitter 66, and returns to the light source side.

The image light of each of blue, green, and red wavelength bands combined by the combination prism are projected on the target surface, whereby an image is formed thereon.

The projector of this embodiment may include an optical path bending mirror, a heat ray cutting filter, a polarization plate, and the like, and may even include a plurality of crystal liquid panels.

The present invention is also applicable to a projector using a display device such as a transmissive liquid crystal panel, a DLP (digital light processing), a micro mirror device, and the like. Further, the liquid crystal projector may take a configuration in which a projection optical system which projects light from the optical modulator on a target surface is provided in the projector body in an interchangeable manner.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2012-235400, filed Oct. 25, 2012, which is hereby incorporated by reference herein in its entirety.

What is claimed is:

1. An illumination optical system configured to illuminate an optical modulator configured to modulate incident light, the illumination optical system comprising:
   a condenser lens system that includes a meniscus lens with a concave on a light source side, and condenses light from a light source; and
   a spherical aberration corrector disposed on an optical modulator side of the condenser lens system, wherein the illumination optical system satisfies:

$$0.6 < |f/L| < 1.4$$

$$0.9 < \sin\theta \leq 1.0$$

where f is a focal length of the condenser lens system, L is a length from an object-side principal point of the condenser lens system to the light source, and θ is half an angle at which the condenser lens system takes in the light from the light source.

2. The illumination optical system according to claim 1, wherein 5 mm<f<50 mm is satisfied.

3. The illumination optical system according to claim 1, further comprising:
   a fly-eye lens configured to divide light emitted from the condenser lens system into a plurality of light fluxes; and
   a polarization converter configured to convert light emitted from the fly-eye lens into linearly polarized light.

4. The illumination optical system according to claim 1, wherein the condenser lens system includes, in order from the light source side, a first spherical lens having a meniscus shape with a concave on the light source side, a second spherical lens having a meniscus shape with a concave on the light source side, and a third spherical lens having a biconvex shape.

5. The illumination optical system according to claim 3, wherein a focal length of a first lens cell of the fly-eye lens is longer than that of a second lens cell closer to an optical axis than the first lens cell.

6. The illumination optical system according to claim 5, which satisfies:

$$2 < fe/fc < 100$$

where fe is the focal length of the first lens cell, and fc is the focal length of the second lens cell.

7. The illumination optical system according to claim 1, wherein the spherical aberration corrector is a meniscus lens with a convex on the light source side, and
   wherein the illumination optical system satisfies:

$$50 \text{ mm} < |fmenis| < 2000 \text{ mm}$$

where fmenis is a focal length of the spherical aberration corrector.

8. The illumination optical system according to claim 1, wherein the light source is a light emitting diode.

9. The illumination optical system according to claim 1, wherein the light source is a laser.

10. The illumination optical system according to claim 1, wherein the light source includes:
    a high-pressure mercury lamp that extends in a direction perpendicular to an optical axis of the illumination optical system, and includes a lamp tube which generates an emission arc; and
    a reflection mirror disposed on an opposite side of the condenser lens system with respect to the lamp tube, and configured to reflect a light flux from the lamp tube to an arc position.

11. The illumination optical system according to claim 10, wherein a trigger line of the lamp tube included in the high-pressure mercury lamp is disposed between the condenser lens system and the reflection mirror.

12. The illumination optical system according to claim 10, wherein the reflection mirror has a toric shape.

13. The illumination optical system according to claim 10, further comprises an anti-reflection structure provided in the lamp tube on a reflection mirror side.

14. A projection-type display apparatus which projects and displays an image on a target surface, the projection-type display apparatus comprising:
   an optical modulator configured to modulate incident light according to an image signal; and
   the illumination optical system according to claim 1 configured to illuminate the optical modulator.

15. The projection-type display apparatus according to claim 14, further comprising a projection optical system configured to project light from the optical modulator on the target surface.

* * * * *